United States Patent [19]

Kato

[11] Patent Number: 5,365,672
[45] Date of Patent: Nov. 22, 1994

[54] POSITIONING APPARATUS FOR A SEMICONDUCTOR WAFER

[75] Inventor: Katsuhiko Kato, Ichinomiya, Japan

[73] Assignee: MECS Corporation, Aichi, Japan

[21] Appl. No.: 137,768

[22] Filed: Oct. 19, 1993

[30] Foreign Application Priority Data

Jan. 26, 1993 [JP] Japan .................. 5-010557

[51] Int. Cl.$^5$ .................. B65G 47/24; G01B 9/00
[52] U.S. Cl. .................. 33/520; 33/1 M;
33/549; 33/644; 198/394; 414/783; 414/754
[58] Field of Search .............. 33/1 M, 706, 707, 520,
33/549, 644; 29/833; 198/394; 364/167.01, 559;
414/749, 654, 783

[56] References Cited

U.S. PATENT DOCUMENTS

| | | | |
|---|---|---|---|
| 4,457,664 | 7/1984 | Judell et al. | 33/520 |
| 4,770,600 | 9/1988 | Ishikawa | 414/783 |
| 4,819,167 | 4/1989 | Cheng et al. | 364/559 |
| 4,833,790 | 5/1989 | Spencer et al. | 33/520 |
| 4,880,348 | 11/1989 | Baker et al. | 414/783 |
| 5,054,991 | 10/1991 | Kato | 414/783 |
| 5,085,558 | 2/1992 | Engelbrecht | 414/754 |
| 5,125,791 | 6/1992 | Volovich | 198/394 |

FOREIGN PATENT DOCUMENTS 54-16984  2/1979  Japan .
3-138957  6/1991  Japan .

Primary Examiner—Christopher W. Fulton
Attorney, Agent, or Firm—Nikaido, Marmelstein, Murray & Oram

[57] ABSTRACT

The method and apparatus for positioning a semiconductor wafer incorporates an X.Y axis drive mechanism for moving a mounting bed with a rotary part mounted on the mounting bed for supporting a wafer horizontally and rotating around the vertical axis. An edge portion distance measuring device optically measures a distance from the center position of the rotary part to the edge portion of the wafer along intervals of a definite angle. A distance and angle calculating device calculates a distance between the center position of the wafer and the rotational center of the rotary part relative to a reference line, and an angle of a line connecting the center position of the wafer and the rotational center of the rotary part with respect to the reference line. A notched portion calculating device calculates a deflection angle of the notched portion of the wafer with respect to the reference line, and a deflection amount calculating device calculates the X.Y deflection amount of the center position produced by moving the center position of the wafer based on the data of the angle and distance calculated by the distance and angle calculating device.

8 Claims, 7 Drawing Sheets

POSITIONING APPARATUS FOR A SEMICONDUCTOR WAFER

BACKGROUND OF THE INVENTION

1. Field of the Invention

The present invention relates to an apparatus and method for orienting a semiconductor wafer or the like during manufacturing or testing processes for the semiconductor device. In the apparatus and method of the invention, the wafer is positioned relative to a notched portion formed on a part of the wafer in preparation of subsequent processing operations.

2. Description of the Prior Art

When semiconductor wafers are subjected to work or measure processing, the wafers are usually put in a rack-shaped cassette and taken out one by one from the cassette by a conveyance apparatus and held on the stage of a processing apparatus. The position of a notched portion of a wafer within the cassette is random, and in the processing apparatus, since positioning is carried out with respect to a notched portion on an edge of the wafer, the wafer must be held on the stage so that the notched portion is at a definite position (e.g., a definite position in the front of the stage).

Therefore a wafer taken out from the cassette is first held on a positioning apparatus by the conveyance apparatus, transferred to the correct position with respect to the notched portion of the wafer and then held on the stage of the processing apparatus.

Positioning apparatuses used in such processes in the prior art generally have structures wherein a wafer is rotatably supported. A rubber roller is pushed to a circumferential edge portion of the wafer and is then rotated and driven. The wafer is thereby rotated, and when a notched portion of the wafer reaches a portion of the rubber roller or a portion of an optical sensor or the like, rotation of the wafer is stopped and the wafer is positioned (refer to, e.g., JPA No. 16984/1979).

However, when the wafer is positioned in this manner, since the circumferential edge portion of the wafer is rotated while being pushed by the rubber roller or is moved contacting with another member, the circumferential edge portion of the wafer may become weak and thus flawed.

Consequently, the present inventor has proposed through JPA No. 138957/1991 a positioning apparatus wherein a circumferential edge portion of a wafer does not contact with any other member such as a roller, while the position of the wafer can be safely and correctly positioned with respect to a notched portion.

In this positioning apparatus, however, a problem exists in that although the wafer can be positioned in a non-contact state safely and correctly with respect to the notched portion, many operations are necessary and a considerable amount of time is required to some degree for the positioning. In particular, during the positioning operation, first, a wafer inserting part is reciprocated and moved in an X-axis direction and the center positions of the wafer and the wafer inserting part are aligned relative to the X-axis. Next, the wafer inserting part is reciprocated and moved in a Y-axis direction and the center positions of the wafer and the wafer inserting part are aligned relative to the Y-axis. Finally the wafer held on the center position of the rotary part is rotated, and the position of the notched portion is detected. This operation is carried out so that the notched portion is positioned to a prescribed angle position of the notched portion.

SUMMARY OF THE INVENTION

Figure 10:
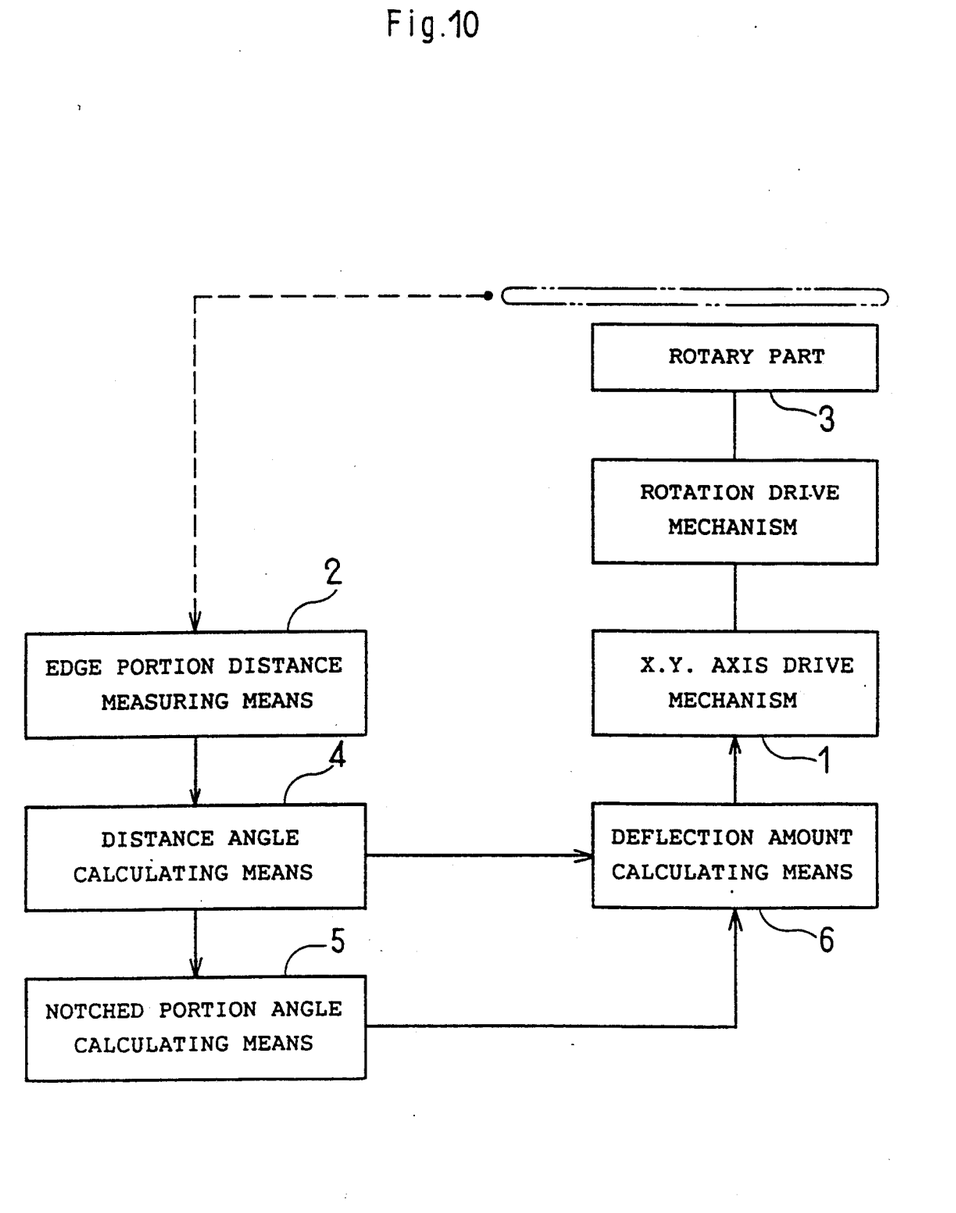
FIG. 10 is a block constitution diagram of the invention.

A positioning apparatus for a wafer of the present invention, as shown in FIG. 10, comprises an X.Y axis drive mechanism 1 for moving a mounting bed in the X-axis and Y-axis directions along the X.Y coordinates on the horizontal plane and a rotation drive mechanism mounted on the mounting bed for supporting substantially the center of the wafer conveyed for the horizontal positioning, rotating and driving of a rotary part 3 rotated around the vertical axis. An edge portion distance measuring means 2 optically measures the distance from the center position of the rotary part 3 to the edge portion of the wafer at intervals of a predetermined angle. A distance and angle calculating means 4 calculates the distance between the center position of the wafer and the rotational center of the rotary part 3, and the angle of the line connecting the center position of the wafer with the rotational center of the rotary part relative to a predetermined reference line, based on the distance from the center position of the rotary part 3 to the edge portion of the wafer measured by the edge portion distance measuring means 2. A notched portion angle calculating means 5 calculates the radius from the center position of the wafer to the edge portion of the wafer as per the intervals of the predetermined angle, and calculates the deflection angle of the notched portion of the wafer with respect to the reference line based on the minimum data of the radius. Also, a deflection amount calculation means 6 calculates the X.Y deflection amount of the center position produced by moving the center position of the wafer when the wafer is rotated by the deflection angle by rotating the rotary part 3 using the rotation drive mechanism, based on the data of the angle and distance calculated by the distance and angle calculating means 4.

In the wafer positioning apparatus having such a structure, the wafer is conveyed in a held state on a hand plate of an exclusive conveyance apparatus or the like. The wafer is held substantially on the center of the rotary part 3 in the origin position of the positioning apparatus, and is attracted and supported horizontally.

Next, the rotational part 3 is rotated one turn, and during the rotation, the edge portion distance measuring means 2 acts and measures the distance from the center position of the rotary part 3 to the edge portion of the wafer at intervals of a definite angle (e.g., 10° less than the circumferential angle of the notched portion).

The distance and angle calculating means 4 then calculates the distance between the center position of the wafer and the rotational center of the rotary part, and the angle of the line connecting the center position of the rotary part with respect to the reference line, based on the distance from the center position of the rotary part 3 to the edge portion of the wafer measured by the edge portion distance measuring means 2.

Next, the notched portion angle calculating means 5 calculates the radius from the center position of the wafer to the edge portion of the wafer in accordance with the intervals of the predetermined angle, and calculates deflection angle of the notched portion of the wafer with respect to the reference line based on the minimum data of the radius.

The deflection amount calculating means 6 calculates the X.Y deflection amount of the center position produced by moving the center position of the wafer when the wafer is rotated by the deflection angle by rotating the rotary part 3, based on the data of the distance and angle calculated by the distance and angle calculating means 4. Finally the rotary part 3 is rotated by the deflection angle calculated as described above, and the X.Y axis drive mechanism 1 moves the mounting bed, that is, the rotary part 3 by the X.Y deflection amount calculated as above described.

In this state, the center position of the wafer supported horizontally on the rotary part 3 is fitted to the origin position previously set, and the angle position of the notched portion of the wafer reaches a state having a definite angle relative to the reference line previously set or a state fitted to the reference line. In either state, the positioning is finished.

Thus the positioning can be carried out in one operation only wherein the wafer is rotated one turn, the position of the edge portion is measured and then the rotary part 3 is rotated by the calculated deflection angle. At the same time the X.Y axis drive mechanism 1 moves the mounting bed, that is, the rotary part 3 by the X.Y deflection amount. As a result, the positioning can be carried out more rapidly in comparison with the prior art and without touching the edge portion of the wafer.

DESCRIPTION OF THE PREFERRED EMBODIMENTS

Embodiments of the present invention will be described referring to the accompanying drawings.

Figure 1:
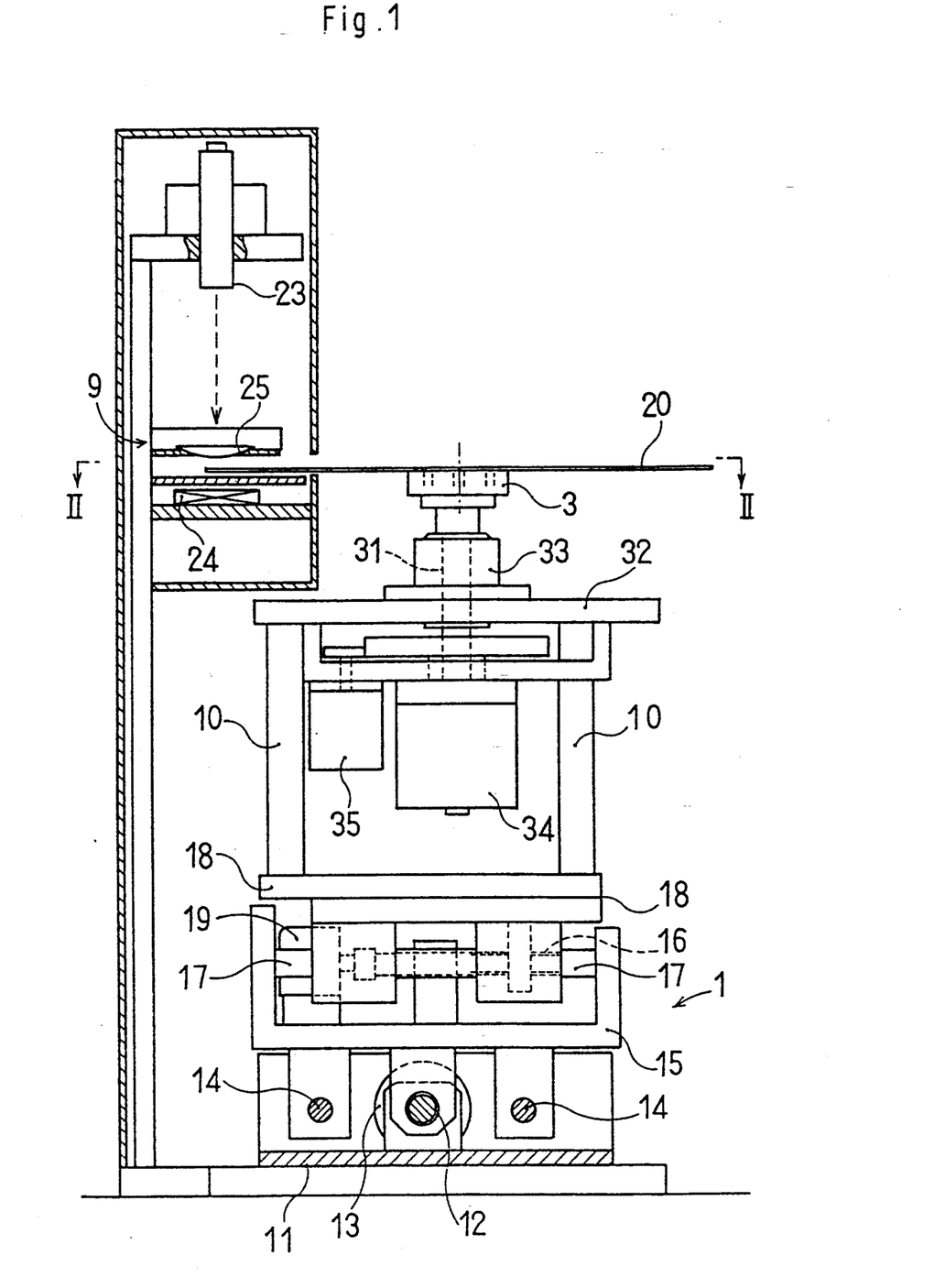
FIG. 1 is a front view partly in section of a positioning apparatus showing an embodiment of the invention.

FIG. 1 shows a plan view partly in section of a positioning apparatus for a wafer. The positioning apparatus is constituted in that a rotary mechanism is provided at the upper side with a rotary part 3 supporting a wafer. Rotation is performed on a mounting bed 18 of an X–Y axis drive mechanism 1 through a rod frame 10.

On a base 11 of the X.Y axis drive mechanism 1, a threaded shaft 12 is mounted in a horizontal direction (Y-axis direction) through a bearing, and can be rotated and driven by a stepper motor 13. Two guide shafts 14 are mounted on the base 11 in the same direction as that of the thread shaft, and a Y-axis moving frame 15 is arranged on the guide shaft 14. A guide block fixed at a lower side of the Y-axis moving frame 15 is externally slidably fitted with the guide shafts 14 on both sides and a tapped hole of a female screw block is threadedly engaged with the thread shaft 12. Consequently, by driving the stepper motor 13, the Y-axis moving frame 15 is moved in the perpendicular direction (Y-axis direction) relative to the plane surface of FIG. 1.

On the Y-axis moving frame 15, a threaded shaft 16 is mounted in the horizontal lateral direction (X-axis direction) through a bearing, and is rotated and driven by a stepper motor 19. Guide shafts 17 are fixed in the same direction on both sides of the thread shaft 16. The mounting bed 18 provided at a lower side with a guide block, and a female screw block is arranged on the Y-axis moving frame 15. The guide block is externally slidably fitted on the guide shaft 17 and the female block is threadedly engaged with the thread shaft 16.

Consequently, by driving the stepper motor 19, the mounting bed 18 is moved in the lateral or horizontal direction (X-axis direction) of FIG. 1. By rotatively driving the stepper motor 13 on the base 11, the mounting bed 18 can be moved in the Y-axis direction.

On the mounting bed 18, a rotary mechanism is fixed horizontally through a rod frame 10 with a plurality of rods arranged longitudinally. A rotary part 3 is arranged at the center position of the rotary mechanism. A rotary shaft 31 of the rotary part 3 is arranged at a lower side vertically and supported by a bearing 33 on a mounting plate 32 fixed to the rod frame 10. The rotary shaft 31 is coupled with a stepper motor 34 fixed at a lower side of the mounting plate 32 through a bracket, and the rotary part 3 is rotated and driven by the stepper motor 34 through the rotary shaft 31.

A rotary encoder 35 is coupled with the rotary shaft 31 through a gear, and outputs a signal corresponding to rotation angle of the rotary part 3. On the upper surface of the rotary part 3, an admission hole for attraction is bored and connected to an admission apparatus (not shown) through a pipe line in the rotary shaft 31 or the like. Although omitted in the drawings, also for the stepper motors 13 and 19, rotary encoders 21, 22 (FIG. 3) which output signals corresponding to the rotation angle are provided.

Further at an upper side of the apparatus, an edge position detector 9 for optically detecting the position of an edge portion of a wafer 20 is arranged. The edge position detector 9 incorporates a laser oscillator (semiconductor laser) 23 irradiating laser light towards the edge portion of the wafer 20 from an upper position downward onto the wafer. A line sensor (one-dimensional CCD) 24 positioned to receive the laser light through a lens 25 along an the edge portion of the wafer 20 is located under the laser oscillator 23 so as to have the edge portion of the wafer 20 positioned between the laser oscillator 23 and the line sensor 24.

Figure 2:
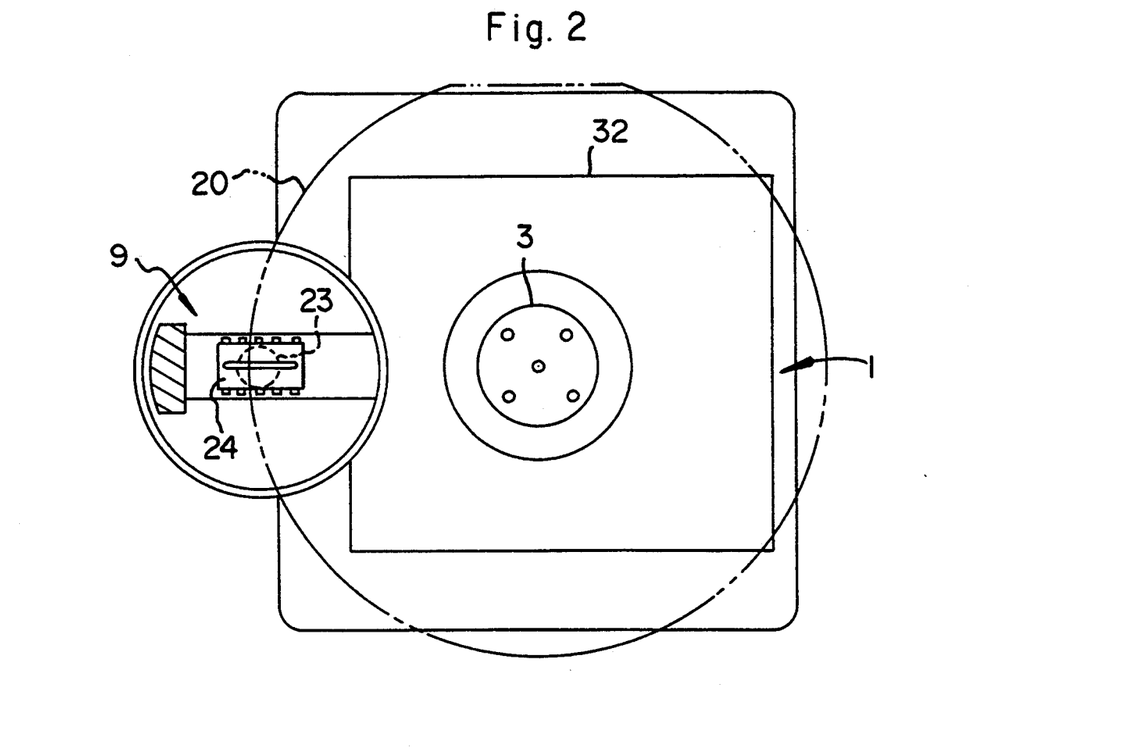
FIG. 2 is a sectional view taken on line II—II of FIG. 1.

As shown in FIG. 2, the line direction of the line sensor 24 is set to the radial direction of the wafer 20, and laser light from the laser oscillator 23 is irradiated as parallel rays having a prescribed spread onto the line sensor 24 through the lens 25. The shadow of the edge portion of the wafer 20 inserted therebetween is formed onto the line sensor. The detected position of the edge portion and thus the calculated distance from the center of the rotary part 3 to the edge portion of the wafer is based on the shadow formed on the line sensor 24.

Figure 3:
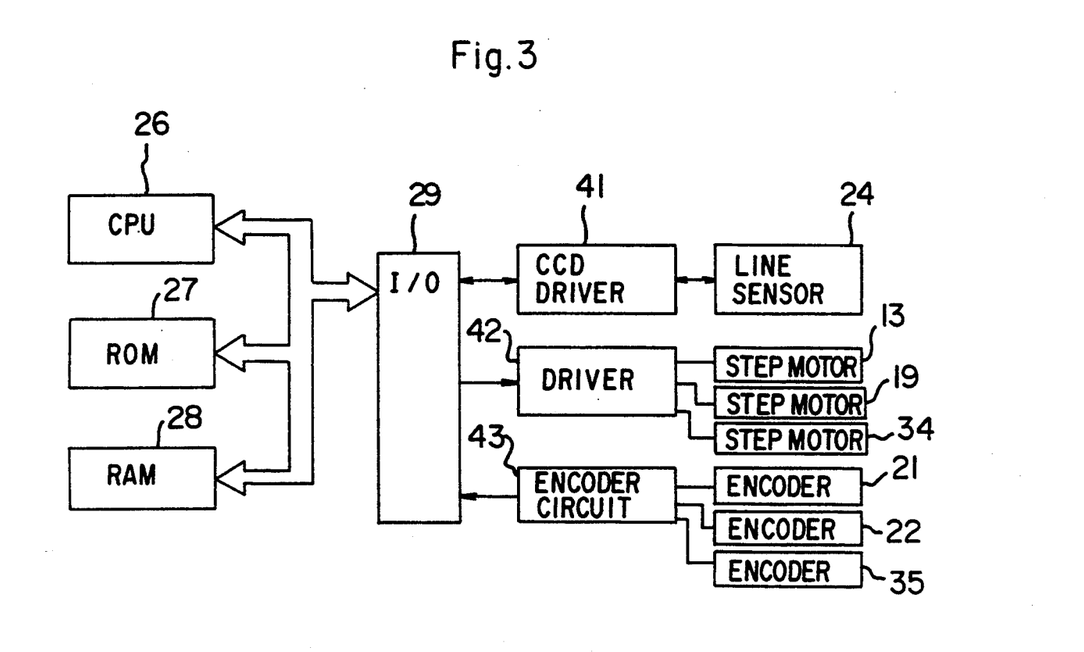
FIG. 3 is a block diagram of a control section of the apparatus.

FIG. 3 shows a block diagram of a control section of the apparatus, and the control section is constituted by a microcomputer as a main part including a CPU 26, a ROM 27, a RAM 28 and an input/output circuit 29. The line sensor 24 is connected through a CCD drive circuit 41 to the input/output circuit 29. Stepper motors 13, 19, 34 are connected through a driver 42 to the input/output circuit 29, and rotary encoders 21, 22, 35 are connected through an encoder circuit 43 to the input/output circuit 29.

The CPU 26 executes the edge portion distance measuring operation processing to measure the distance based on the detected data from the line sensor 24, the distance and angle operation processing, the deflection amount operation processing and the like. The CPU 26 also drives and controls the rotary part 3 and the X.Y axis drive mechanism 1 based on the program previously stored in the ROM 27.

Figure 4:
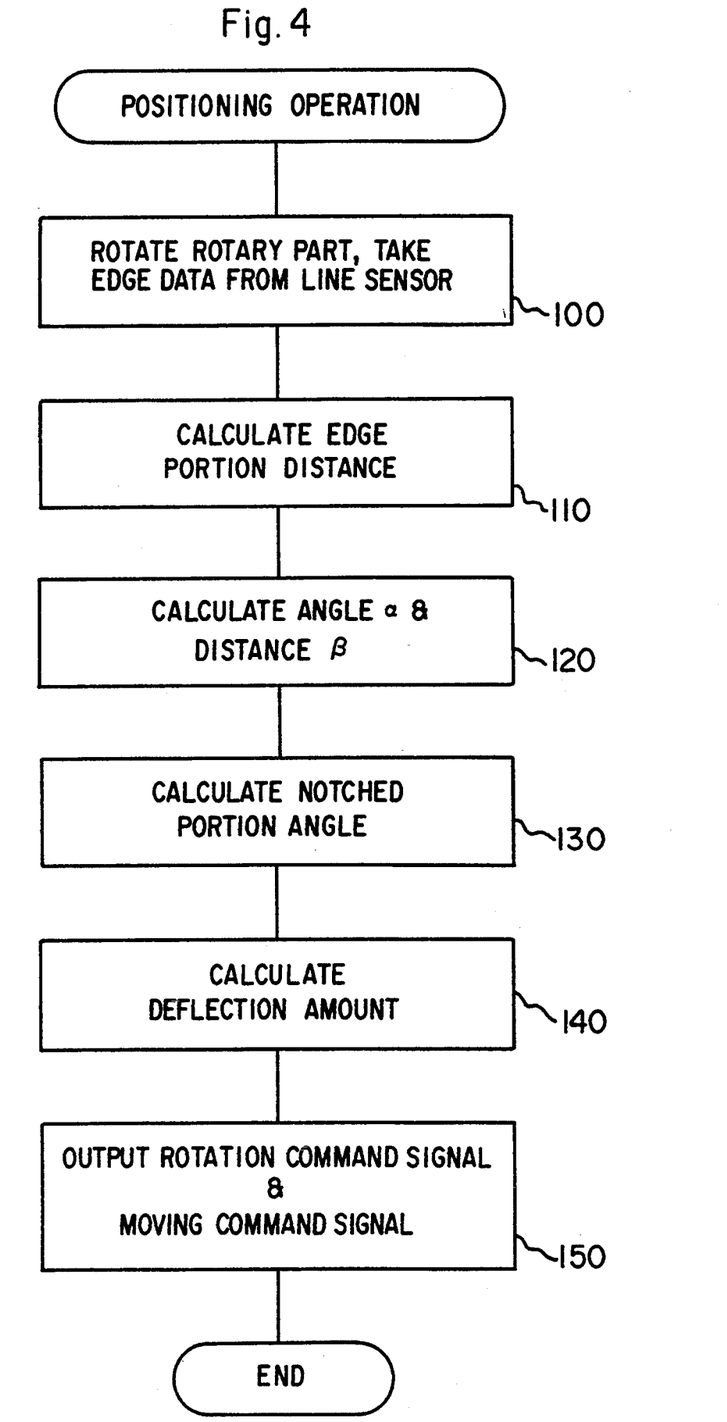
FIG. 4 is a flow chart showing the operation of the apparatus.

Next, the operation of the positioning apparatus with the above-mentioned constitution will be described with reference to the flow chart of FIG. 4.

The wafer 20 is conveyed while held on a hand plate of an exclusive conveyance apparatus (not shown). The wafer is held substantially in the center of the rotary part 3 and positioned on a center or origin position O initially defined for the rotary part 3. Further, the wafer is supported horizontally on the rotary part 3. The wafer 20 is assumed to have its center position S shifted from the center (or origin) position O of the rotary part 3. For example, it may be held on a position similar to that shown in FIG. 5.

First, in step 100, the CPU 26 drives the stepper motor 34 and rotates the rotary part 3 one turn. During this process, the CPU 26 operates the line sensor 24 and takes the edge position detection data from the sensor at intervals of a prescribed rotation angle 74 (e.g., 10° less than circumferential angle of a notched portion). In step 110, the distance from the center position O of the rotary part 3 to the edge portion of the wafer 20 is calculated, based on the edge position data.

Figure 5:
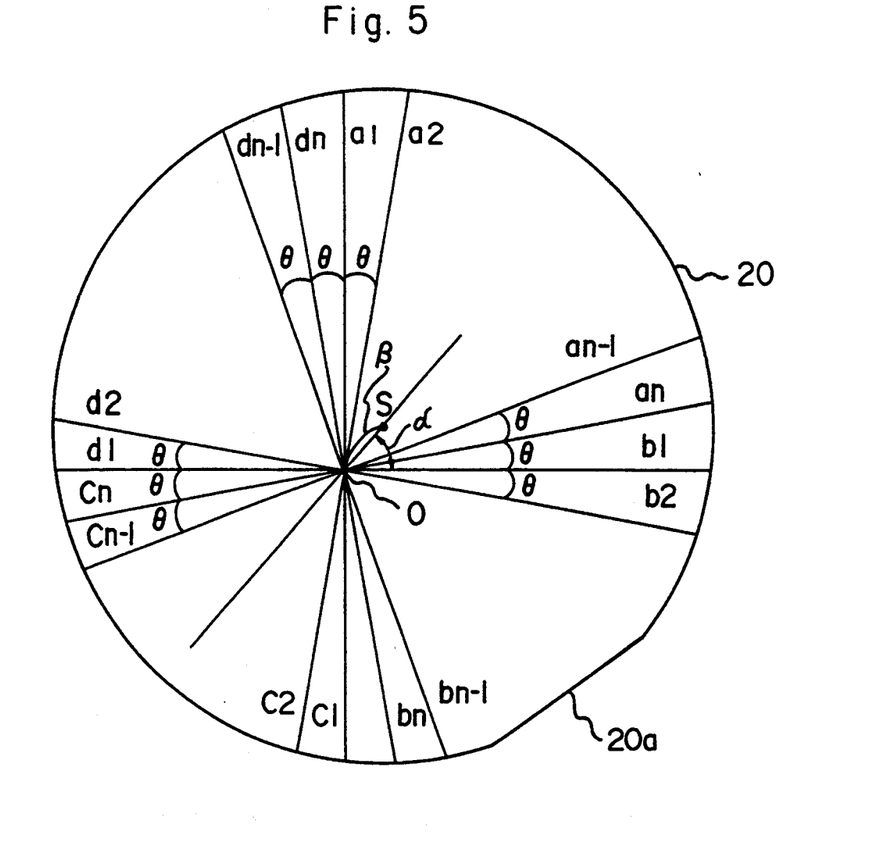
FIG. 5 is a plan explanation diagram of the wafer showing the distance $\beta$ of the line connecting the center position O of a rotary part and the center position S of a wafer and the angle $\alpha$ thereof.
Figure 6:
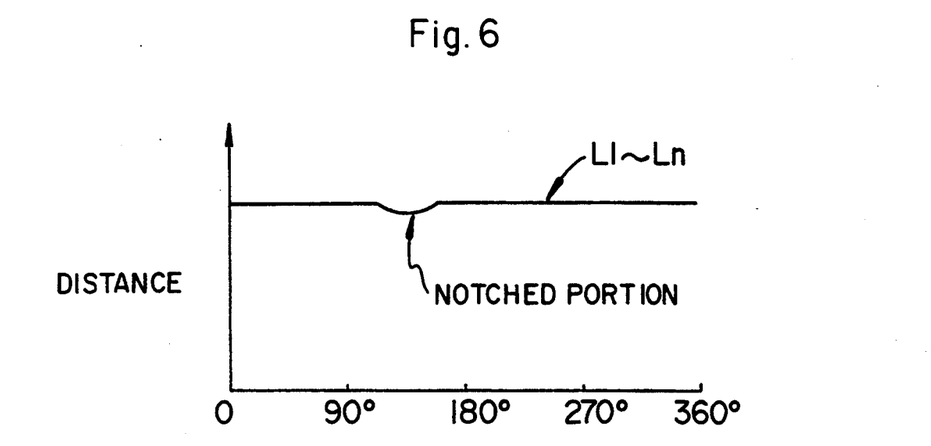
FIG. 6 is a graph diagram showing the sum values L1–Ln relative to the circumference of the wafer.

All of the calculated data are classified and grouped in intervals of 90° as distance data $a_1-a_n$, $b_1-b_n$, $c_1-c_n$, $d_1-d_n$ as illustrated in FIG. 5. From each set of distance data per 90° interval, sum values are added where $L1=a_1+b_1+c_1+d_1$, $L2=a_2+b_2+c_2+d_2$, ... $Ln=a_n+b_n+c_n+d_n$. The sum values L1–Ln from the center position O to the edge portion are thus calculated. The sum values L1–Ln are approximately constant as shown in FIG. 6, and when the notched portion 20a of the wafer 20 is included in the edge portion, the sum value of the distance data that includes the radius of the notched portion 20a results in a minimum value. The maximum values a, b, c and d of the distance data are used in the arithmetic operations for the distance $\beta$ and angle $\alpha$.

Figure 7:
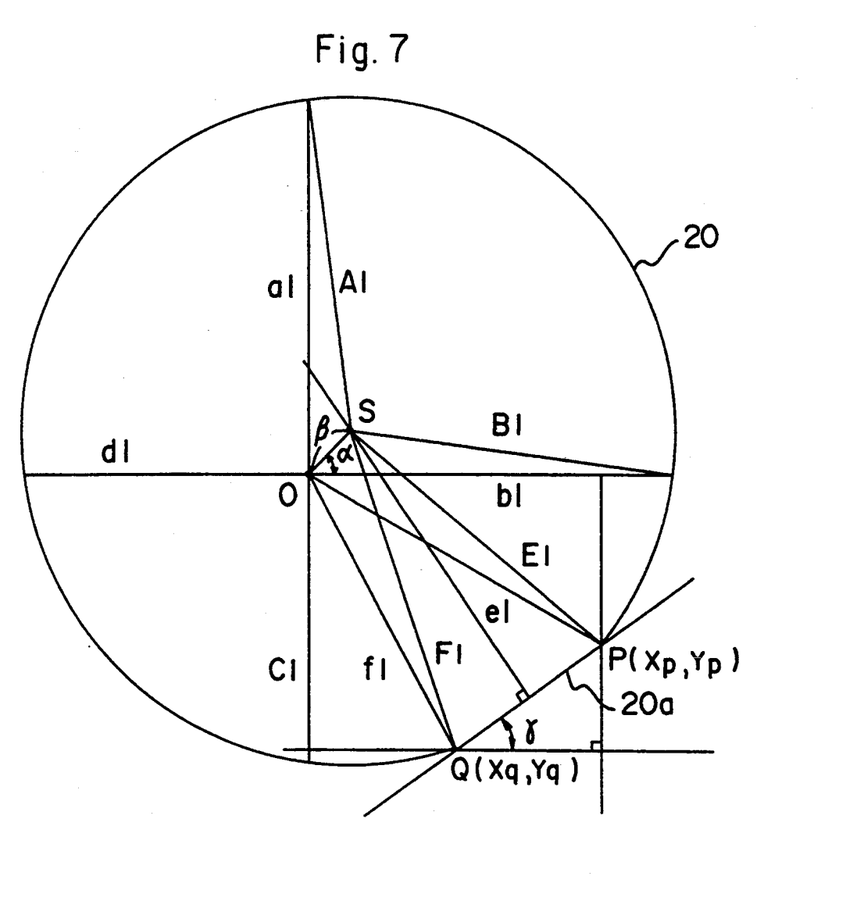
FIG. 7 is a plan explanation diagram of the wafer showing the deflection angle 7 of a notched portion.

Next, in step 120, as illustrated in FIG. 7, the distance $\beta$ from the center position O to the center position S of the wafer 20 and the angle $\alpha$ of the line between the center positions 0 and S (relative to a reference line defined for the apparatus) are calculated. The angle $\alpha$ and the distance $\gamma$ are calculated from following equations using the maximum values a–d:

$$\alpha = \tan^{-1}\{(a-c)/(b-d)\} - \theta$$

$$\beta = \{(a-c)^2 + (b-d)^2\}^{\frac{1}{2}}$$

Next, in step 130, the CPU 26 calculates the radius from the center position S of the wafer 20 to the edge portion of the wafer 20 according to the intervals of the predetermined angle (e.g., 10°), and calculates the deflection angle $\gamma$ of the notched portion 20a of the wafer 20 with respect to the reference line of the positioning apparatus based on the minimum values of the distance data. That is, using the data of the distance $a_1-a_n$ to the edge portion, angle $\alpha$, distance $\gamma$, the angle $\theta$ and the equations:

$$g = \beta \cdot \cos(\{\alpha + \theta - 90°\})/2$$

$$h = \beta \cdot \sin(\{\alpha + \theta - 90°\})/2$$

$$An = \{(a_n - g)^2 + h^2\}^{\frac{1}{2}}$$

each of the distances A1–An from the center position S of the wafer to the edge portion is calculated. Also using the data of the distance $b_1-b_n$, the angle $\alpha$, the distance $\beta$, the angle $\theta$ and the above-mentioned equations, the distances B1–Bn from the center position S of the wafer to the edge portion are calculated. The distance C1–Cn from the center position S of the wafer and distance D1–Dn are similarly calculated.

Figure 8:
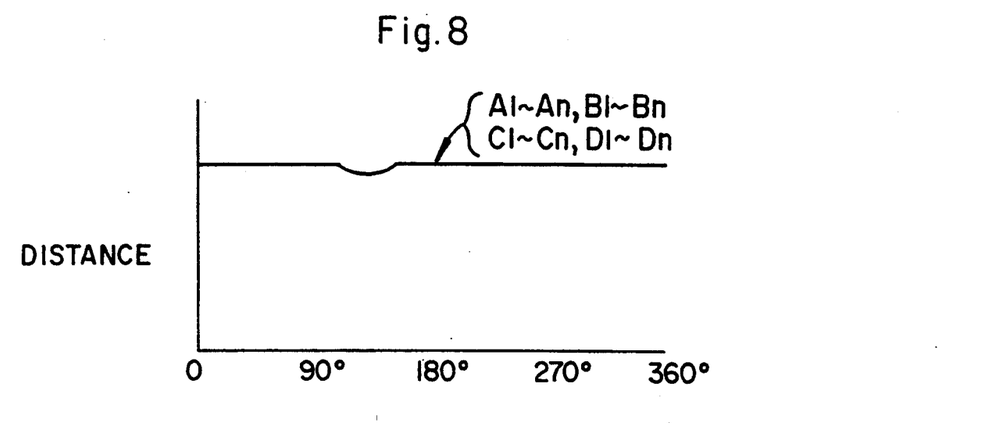
FIG. 8 is a graph diagram showing the distances from the center position S of a wafer to the edge portions of the wafer along its entire circumference.

Since the calculated distances (i.e., A1–An, B1–Bn, C1–Cn and D1–Dn) all correspond to the radius of the wafer, as shown in FIG. 8, all distances except for those including the notched portion 20a have approximately the same value. In order to calculate the angle of the notched portion 20a relative to the reference line, two distances E1 and F1 (See FIG. 7) relative to the center position S and the outer edges of the notched portion 20a are derived from the minimum values of the calculated distances discussed above. The distances E1 and F1 are derived from the outermost minimum values of the calculated distances within the edge portion of the wafer having the notched portion.

As shown in FIG. 7, X.Y coordinates (Xp, Yp) of intersection P and X.Y coordinates (Xq, Yq) of intersection Q between radius lines of distance E1 and F1 and the notched portion 20a are calculated. The deflection angle $\gamma$ of a line defined along the notched portion and passing through the X.Y coordinates (Xp, Yp) of the intersection P, and the X.Y coordinates (Xq, Yq) of the intersection Q with respect to the reference line is calculated from following equation:

$$\gamma = \tan^{-1}\{(Yp - Yg)/(Xp - Xq)\}$$

Next in step 140, the CPU 26 calculates the X.Y deflection amount of the center position Sa produced by moving the center position S of the wafer 20 when the wafer 20 is rotated by the deflection angle $\gamma$ by rotating the rotary part 3, based on the data of the distance $\beta$ and the angle $\alpha$ calculated as described above.

Figure 9:
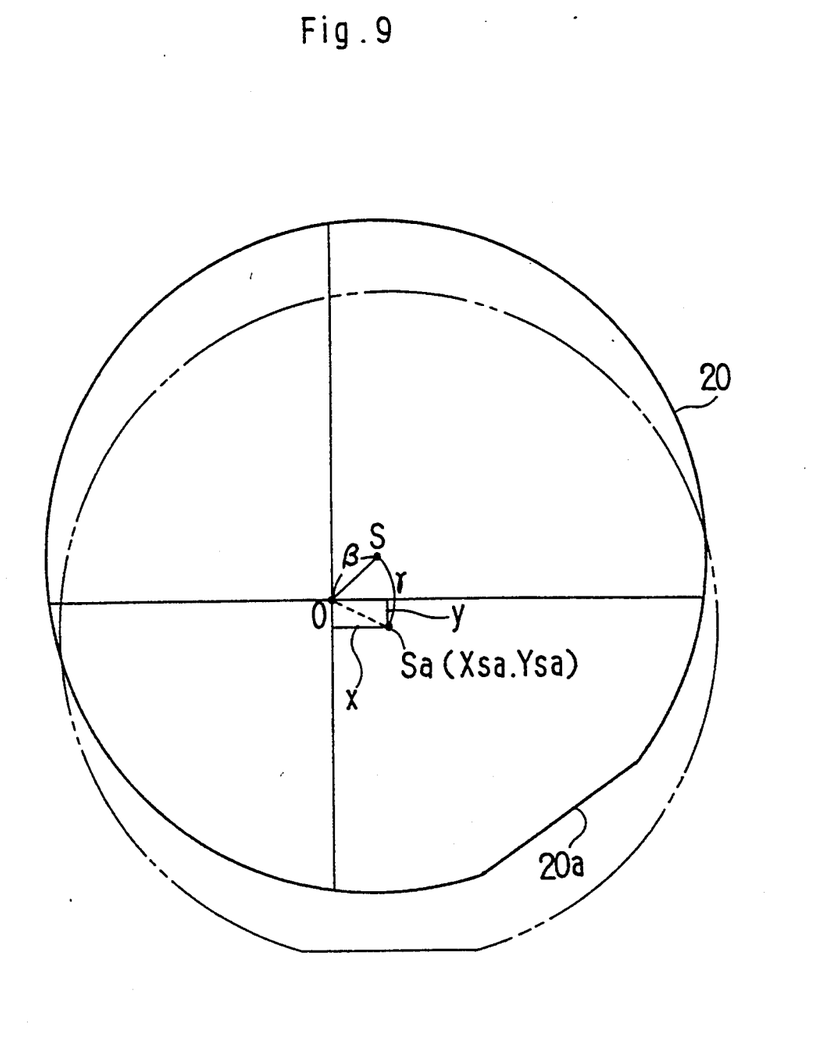
FIG. 9 is a plan view of the wafer showing the deflection angle $\gamma$ and the X.Y deflection amount.

The X.Y deflection amount of the center position Sa, that is, the X.Y coordinates (Xsa, Ysa) of the center position Sa as illustrated in FIG. 9 is calculated from the following equations:

$$Xsa = \beta \cos(\{\gamma - \alpha\})$$

$$Ysa = \beta \sin(\{\gamma - \alpha\})$$

In step 150, a rotation command signal based on the deflection angle $\gamma$ is outputted to the driver 42 and a moving command signal based on the deflection amount data is outputted to the driver 42. The rotary part 3 is rotated by the calculated deflection angle $\gamma$, and the X.Y axis drive mechanism 1 moves the mounting bed, that is, the rotary part 3 by the X.Y deflection amount (Xsa, Ysa) calculated as above described, so as to eliminate the deflection.

In this state, the center position of the wafer 20 supported horizontally on the rotary part 3 is fitted to the origin position (the initial center position O of the rotary part 3) previously set, and the angle position of the notched portion of the wafer 20 reaches the state having a definite angle relative to the reference line previously set or the state wherein the wafer 20 is fitted to the reference line. In either state, the positioning of the wafer 20 is finished.

Since the positioning can be carried out by one operation only wherein the wafer 20 is rotated one turn, the position of the edge portion is measured and then the rotary part 3 is rotated by the calculated deflection angle, while at the same time the X.Y axis drive mechanism moves the mounting bed, that is, the rotary part 3 by the calculated X.Y deflection amount, the position can be carried out more rapidly in comparison with the prior art and without touching the edge portion of the wafer 20.

Afterwards, the wafer 20 positioned and held on the rotary part 3, after reading a mask or the like displayed thereon by a camera or the like, is elevated again by the hand plate and conveyed to a prescribed location.

In the embodiment described above, although the reference line for the notched portion is lined up in parallel to the lateral axis (X-axis) in FIG. 9 for example, the reference line may be set to any angle.

Although a specific embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A positioning apparatus for a semiconductor wafer having a notched portion, said apparatus comprising:
   a mounting bed;
   an X.Y axis drive mechanism for moving said mounting bed on a horizontal plane;
   a rotary part mounted on said mounting bed for horizontally supporting the wafer, and for positioning and rotating the wafer around a vertical axis;
   a rotation drive mechanism for rotating and driving said rotary part;
   an edge portion distance measuring means for optically measuring a distance from a center position of the rotary part to an edge portion of the wafer at intervals of a predetermined angle;
   a distance and angle calculating means for calculating a distance between the center position of the wafer and a rotational center of said rotary part, and for calculating an angle of a line connecting the center position of the wafer and the rotational center of said rotary part, said distance and angle calculating means calculating the distance and angle based on the distance from the center position of said rotary part to the edge portion of the wafer measured by said edge portion distance measuring means and relative to a reference line of said apparatus;
   a notched portion angle calculating means for calculating radius data from a center position of the wafer to the edge portion of the wafer at the intervals of the predetermined angle, and for calculating a deflection angle of the notched portion of the wafer with respect to the reference line based on the radius data having minimum values; and
   a deflection amount calculating means for calculating X.Y deflection of the center position produced by moving the center position of the wafer when the wafer is rotated based on the deflection angle by rotating said rotary part with said rotation drive mechanism, said deflection amount calculating means calculating the X.Y deflection based on data of the angle and distance calculated by said distance and angle calculating means.

2. A positioning apparatus as set forth in claim 1, wherein said edge portion distance measuring means includes a laser oscillator and a line sensor set in a radial direction of the wafer, laser light from the laser oscillator being received at the edge portion of the wafer by the line sensor so as to measure the distance from a center position of said rotary part to the edge portion of the wafer, based on data of a position of the edge portion of the wafer detected by the line sensor.

3. A method for positioning a semiconductor wafer having a notched portion, said method comprising the steps of:
   rotating a rotary part holding the wafer and measuring a distance from a center position of said rotary part to an edge portion of the wafer at intervals of a predetermined angle;
   calculating a distance between a center position of the wafer and a rotational center of said rotary part, and an angle of a line connecting the center position of the wafer and the rotational center of said rotary part as an angle relative to a reference line, based on the distance between the center position of said rotary part and the edge portion of the wafer;
   calculating a radius from the center position of the wafer to the edge portion of the wafer at the intervals of the predetermined angle and calculating a deflection angle of the notched portion of the wafer with respect to the reference line based on radius data having minimum values;
   calculating an X.Y deflection amount of the center position of the wafer when the wafer is rotated by the deflection angle by rotating the rotary part, based on data of the distance and the angle calculated; and
   rotating the rotary part by the deflection angle and moving said rotary part in an X.Y direction by the X.Y deflection amount for positioning the wafer.

4. A positioning system for a semiconductor wafer processing device having a mounting bed, an X.Y axis drive mechanism for moving the mounting bed on a horizontal plane relative to a reference line of the apparatus, a rotary part mounted on the mounting bed for horizontally supporting a wafer to be positioned and rotated relative to a vertical axis and a rotation drive mechanism for rotating and driving the rotary part, said positioning system comprising:
   an edge portion distance measuring means for optically measuring distances from a center position of the rotary part to a plurality of edge portions of the wafer at intervals of a predetermined angle;
   a distance and angle calculating means for calculating a distance between the center position of the wafer and a rotational center of said rotary part, and for calculating an angle between a center position of the wafer and the rotational center of the rotary part relative to the reference line, said distance and angle calculating means calculating the distance and angle based on the distances measured by said edge portion distance measuring means;

a notched portion angle calculating means for calculating radius data from the center position of the wafer to the edge portion of the wafer at the intervals of the predetermined angle, and for calculating a deflection angle of a notched portion of the wafer with respect to the reference line based on minimum values of the distances measured by said edge portion distance measuring means; and a deflection amount calculating means for calculating X.Y deflection of the center position produced by moving the center position of the wafer when the wafer is rotated by rotating the rotary part based on the deflection angle, said deflection amount calculating means calculating the X.Y deflection based on the angle and distance calculated by said distance and angle calculating means.

5. A positioning system as set forth in claim 4, wherein said edge portion distance measuring means includes a laser oscillator and a line sensor means positioned along an edge portion of the wafer, for receiving laser light from the laser oscillator at the edge portion of the wafer so as to measure a distance from the center position of the rotary part to the edge portion of the wafer for the plurality of edge portions of the wafer, said line sensor means being further for detecting a shadow formed by the plurality of edge portions of the wafer on the line sensor means.

6. A method for positioning a semiconductor wafer having a notched portion, comprising the steps of:
rotating a rotary part holding a wafer;
measuring a distance from a center position of said rotary part to a plurality of edge portions of the wafer at intervals of a predetermined angle while rotating the rotary part;
calculating a distance between a center position of the wafer and a rotational center of said rotary part, and an angle of a line connecting the center position of the wafer and the rotational center of said rotary part as an angle relative to a reference line, based on a distance between the center position of said rotary part and the plurality of edge portions of the wafer;
calculating radius data from the center position of the wafer to the plurality of edge portions of the wafer at the intervals of the predetermined angle and calculating a deflection angle of the notched portion of the wafer with respect to the reference line based on radius data having minimum values;
rotating the rotary part by the deflection angle;
calculating an X.Y deflection amount of the center position of the wafer when the wafer is rotated by the deflection angle on the rotary part, based on data of the distance and the angle calculated; and
and moving said rotary part in an X.Y direction by the X.Y deflection amount for positioning the wafer.

7. A positioning apparatus for a semiconductor wafer having a notched portion, comprising:
a mounting bed;
an X.Y axis drive mechanism for moving said mounting bed on a horizontal plane;
a rotary part mounted on said mounting bed for horizontally supporting a wafer, and for positioning and rotating the wafer around a vertical axis;
a rotation drive mechanism for rotating and driving said rotary part;
an edge portion distance measuring means for optically measuring a distance from a center position of the rotary part to an edge portion of the wafer while said rotation drive mechanism rotates said rotary part at intervals of a predetermined angle along an entire periphery of the wafer;
a distance and angle calculating means for calculating a distance between a center position of the wafer and the center position of said rotary part, and for calculating an angle of a line connecting the center position of the wafer and the center position of said rotary part, based on the distance from the center position of said rotary part to the edge portion of the wafer measured by said edge portion distance measuring means and relative to a reference line of said apparatus;
a notched portion angle calculating means for calculating radius data from a center position of the wafer to the edge portion of the wafer at the intervals of the predetermined angle, and for calculating a deflection angle of the notched portion of the wafer with respect to the reference line based on the radius data having minimum values;
control means connected to said notched portion angle calculating means, for controlling said rotation drive mechanism so as to rotate said rotary part based on the calculated deflection angle; and
a deflection amount calculating means for calculating X.Y deflection of the center position produced by moving the center position of the wafer when the wafer is rotated based on the deflection angle, based on data of the angle and distance calculated by said distance and angle calculating means, said control means being further for controlling said X.Y axis drive mechanism so as to move said mounting bed based on the calculated X.Y deflection.

8. A positioning apparatus as set forth in claim 7, wherein said edge portion distance measuring means includes a laser oscillator and a line sensor set in a radial direction of the wafer, for detecting laser light from the laser oscillator when a shadow at the edge portion of the wafer is formed on the line sensor by the laser light so as to measure the distance from a center position of said rotary part to the edge portion of the wafer.

* * * * *